United States Patent
Xu

(10) Patent No.: US 9,998,012 B2
(45) Date of Patent: *Jun. 12, 2018

(54) VOLTAGE PEAK DETECTION CIRCUIT AND DETECTION METHOD

(71) Applicant: Silergy Semiconductor Technology (Hangzhou) LTD, Hangzhou, ZheJiang Province (CN)

(72) Inventor: Xiaoru Xu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/292,929

(22) Filed: Oct. 13, 2016

(65) Prior Publication Data

US 2017/0033697 A1 Feb. 2, 2017

Related U.S. Application Data

(63) Continuation of application No. 14/174,531, filed on Feb. 6, 2014, now Pat. No. 9,488,680.

(30) Foreign Application Priority Data

Mar. 11, 2013 (CN) .......................... 2013 1 0076683

(51) Int. Cl.
*H02M 3/335* (2006.01)
*H02M 1/32* (2007.01)
*H02M 1/00* (2006.01)
*G01R 19/04* (2006.01)
*H02M 7/217* (2006.01)

(52) U.S. Cl.
CPC ........ *H02M 3/33507* (2013.01); *G01R 19/04* (2013.01); *H02M 7/2176* (2013.01); *H02M 2001/0022* (2013.01)

(58) Field of Classification Search
CPC ......... H02M 3/33507; H02M 3/33523; H02M 2001/0022; H02M 2001/007; H02M 7/06; H02M 3/335; H02M 1/32; G01R 19/04
See application file for complete search history.

(56) References Cited

U.S. PATENT DOCUMENTS

| 6,134,123 A * | 10/2000 | Yamada ............ H02M 3/33507 363/21.13 |
| 8,081,495 B2 * | 12/2011 | Vecera .................... H02M 1/32 363/21.12 |
| 8,503,144 B2 | 8/2013 | Tsai et al. |
| 2006/0077697 A1 * | 4/2006 | Yang ................. H02M 3/33507 363/21.13 |
| 2007/0047269 A1 | 3/2007 | Hachiya |

(Continued)

FOREIGN PATENT DOCUMENTS

CN 1379545 A 11/2002

*Primary Examiner* — Adolf Berhane
*Assistant Examiner* — Sisay G Tiku
(74) *Attorney, Agent, or Firm* — Michael C. Stephens, Jr.

(57) ABSTRACT

In one embodiment, a voltage peak detection circuit can include: (i) a voltage coupling circuit configured to inductively couple an input inductor voltage of a switching power supply, and to generate a first voltage that represents a DC input voltage of the switching power supply; (ii) a voltage conversion circuit configured to receive the first voltage, and to generate a second voltage that is proportional to the first voltage; and (iii) a holding circuit configured to hold a peak of the second voltage to generate a peak voltage signal that represents peak information of the DC input voltage.

20 Claims, 4 Drawing Sheets

(56) References Cited

U.S. PATENT DOCUMENTS

| | | | |
|---|---|---|---|
| 2008/0259652 A1* | 10/2008 | Huynh | H02M 3/33507 363/21.12 |
| 2010/0142230 A1* | 6/2010 | Schroder Genannt Berghegger | H02M 3/33523 363/21.12 |
| 2012/0075891 A1* | 3/2012 | Zhang | H02M 3/33523 363/21.18 |
| 2013/0162297 A1* | 6/2013 | Gravati | H03K 5/1532 327/58 |
| 2013/0215649 A1* | 8/2013 | Huang | H02M 3/33523 363/21.17 |
| 2013/0223108 A1* | 8/2013 | Xu | H02M 3/33507 363/21.17 |
| 2013/0250629 A1* | 9/2013 | Xu | H02M 3/33523 363/21.17 |
| 2013/0294118 A1* | 11/2013 | So | H02M 3/33507 363/21.16 |
| 2013/0342243 A1 | 12/2013 | Chen et al. | |
| 2014/0009080 A1 | 1/2014 | Xu | |
| 2014/0286058 A1* | 9/2014 | Xu | H02M 1/32 363/21.17 |
| 2014/0307485 A1* | 10/2014 | Xu | H02M 3/33523 363/21.13 |
| 2014/0307486 A1* | 10/2014 | Huang | H02M 3/33507 363/21.16 |
| 2014/0313786 A1* | 10/2014 | Chen | H02M 1/4266 363/21.01 |
| 2015/0214829 A1* | 7/2015 | Xu | H02M 1/083 363/21.03 |
| 2016/0172983 A1* | 6/2016 | Huang | H02M 3/33507 363/21.12 |
| 2017/0025957 A1* | 1/2017 | Zhang | H02M 3/33507 |

* cited by examiner

VOLTAGE PEAK DETECTION CIRCUIT AND DETECTION METHOD

RELATED APPLICATIONS

This application is a continuation of the following application, U.S. patent application Ser. No. 14/174,531, filed on Feb. 6, 2014, and which is hereby incorporated by reference as if it is set forth in full in this specification, and which also claims the benefit of Chinese Patent Application No. 201310076683.4, filed on Mar. 11, 2013, which is incorporated herein by reference in its entirety.

FIELD OF THE INVENTION

The present invention relates to the field of power electronics, and more particularly to a voltage peak detection circuit and an associated detection method.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. In this way, the output voltage and/or the output current of the switching power supply can be maintained as substantially constant. Therefore, the selection and design of the particular control circuitry and approach is very important to the overall performance of the switching power supply. Thus, using different detection signals and/or control circuits can result in different control effects on power supply performance.

SUMMARY

In one embodiment, a voltage peak detection circuit can include: (i) a voltage coupling circuit configured to inductively couple an input inductor voltage of a switching power supply, and to generate a first voltage that represents a DC input voltage of the switching power supply; (ii) a voltage conversion circuit configured to receive the first voltage, and to generate a second voltage that is proportional to the first voltage; and (iii) a holding circuit configured to hold a peak of the second voltage to generate a peak voltage signal that represents peak information of the DC input voltage.

In one embodiment, a method of detecting a voltage peak for a switching power supply, can include: (i) generating a first voltage that represents a DC input voltage of the switching power supply by coupling an input inductor voltage of the switching power supply; (ii) performing, by a voltage conversion circuit, a conversion on the first voltage to generate a second voltage that is proportional to the first voltage; and (iii) generating a peak voltage signal by holding a peak of the second voltage, where the peak voltage signal represents peak information of the DC input voltage.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
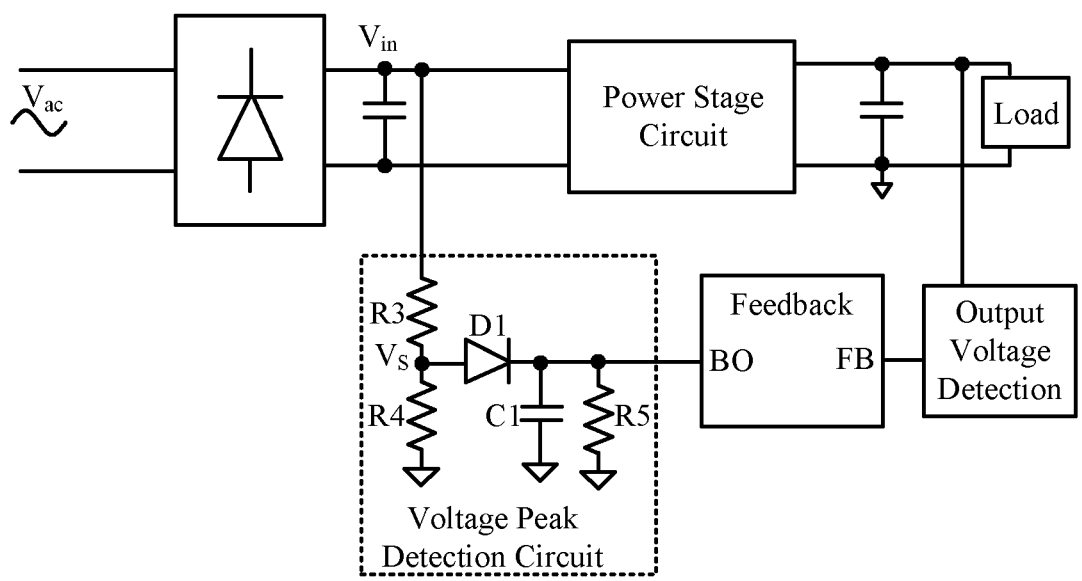
FIG. 1 is a schematic block diagram of an example voltage peak detection circuit.

Referring now to FIG. 1, shown is a schematic block diagram of an example voltage peak detection circuit. In a power supply switch circuit, the peak value of an input voltage signal may be detected and saved for an associated control circuit. Generally, a peak detection circuit may be utilized to sense or otherwise detect an input voltage signal, and to provide accurate peak information. For example, a DC input voltage signal of the switching power supply can be detected by a resistance divider network including resistors R3 and R4, to generate voltage signal $V_S$ that represents DC input voltage signal $V_{in}$.

When voltage signal $V_S$ is less than a voltage across capacitor C1, diode D1 may not conduct, and capacitor C1 can be discharged through resistor R5. For example, the voltage across capacitor C1 can represent peak information for DC input voltage signal $V_{in}$. In order to determine accurate input voltage peak information, the capacitance of capacitor C1 should be sufficiently large so as to prevent the voltage across capacitor C1 from inadvertently discharging during a decreasing portion of DC input voltage signal $V_{in}$.

In addition, the voltage peak detection circuit may need to response to a peak of a high speed or transient input voltage signal. In the arrangement of FIG. 1, the time constant T of the peak detection circuit may be, e.g., about 100 ms. When the capacitance of capacitor C1 is 100 pF, the resistance of resistor R5 can be as shown below in formula (1).

$$R_5 = \frac{100 \text{ ms}}{100 PF} = 1 G\Omega \qquad (1)$$

It can be seen from formula (1) that the resistance of resistor R5 in this example is very large. Thus, the size in terms of layout or circuit board area, as well as product costs may also be relatively high, and thus may not be conducive to circuit integration. Therefore, in particular embodiments, a voltage peak detection circuit with a low circuit product cost and relatively small area/volume is provided to detect and hold peak information of the input voltage of a switching power supply.

In one embodiment, a voltage peak detection circuit can include: (i) a voltage coupling circuit configured to inductively couple an input inductor voltage of a switching power supply, and to generate a first voltage that represents a DC input voltage of the switching power supply; (ii) a voltage conversion circuit configured to receive the first voltage, and to generate a second voltage that is proportional to the first voltage; and (iii) a holding circuit configured to hold a peak of the second voltage to generate a peak voltage signal that represents peak information of the DC input voltage.

Figure 2:
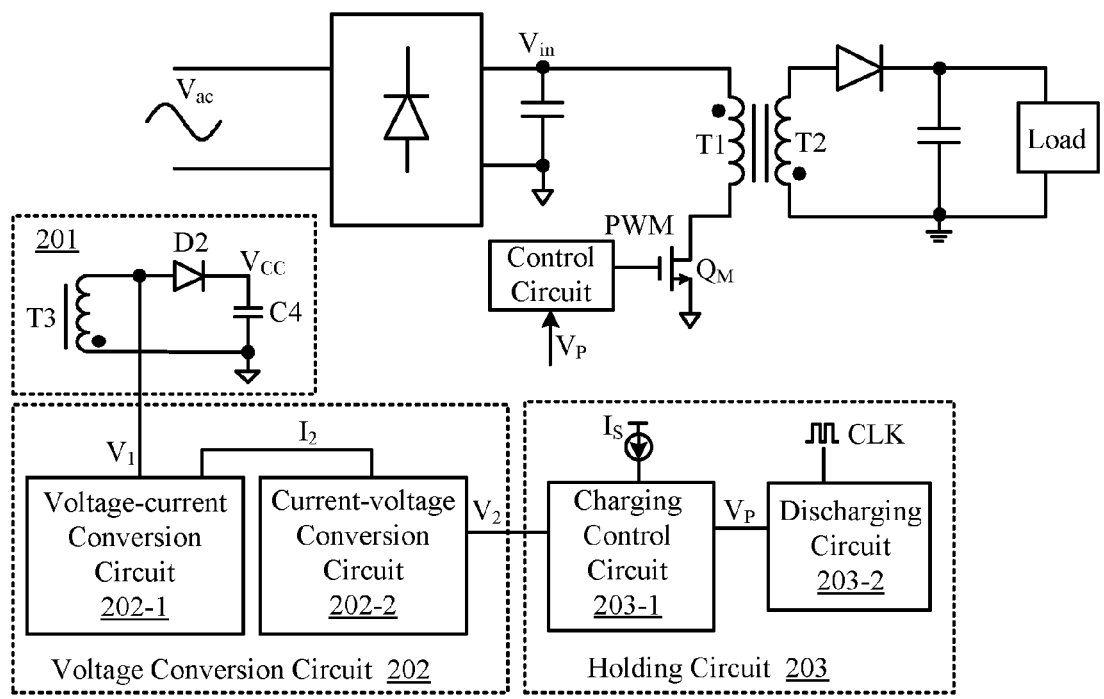
FIG. 2 is a schematic block diagram of an example voltage peak detection circuit in accordance with embodiments of the present invention.

Referring now to FIG. 2, shown is a schematic block diagram of an example voltage peak detection circuit in accordance with embodiments of the present invention. The voltage peak detection circuit can be applied in a switching or switched-mode power supply (SMPS). In this particular example, a flyback topology switching power supply is shown; however, any suitable converter topology (e.g., boost, buck, buck-boost, forward, SEPIC, ZETA, etc.) can be employed in certain embodiments. Here, a power stage circuit can include a transformer including primary winding T1 and secondary winding T2. The winding turns of primary winding T1 can be indicated as N1, and the winding turns of secondary winding T2 can be indicated as N2.

The example voltage peak detection circuit can include voltage coupling circuit 201, voltage conversion circuit 202, and holding circuit 203. Here, voltage coupling circuit 201 can include auxiliary inductor T3 that is inductively coupled with an input inductor (e.g., primary winding T1) of the switching power supply. Voltage/signal $V_1$ can be generated according to an induced voltage of auxiliary inductor T3. The windings or number of turns of auxiliary inductor T3 can be indicated as N3, so voltage $V_1$ can represent information related to DC input voltage $V_{in}$ of the switching power supply. Also, diode D2 and capacitor C4 can supply bias voltage $V_{CC}$ for the circuit control chip.

In particular embodiments, voltage conversion circuit 202 can include voltage-current conversion circuit 202-1 and current-voltage conversion circuit 202-2. Voltage-current conversion circuit 202-1 can be coupled with voltage coupling circuit 201 to receive voltage $V_1$, and to generate current $I_1$ based on voltage $V_1$. Also, voltage-current conversion circuit 202-1 can perform a mirroring process on current $I_1$ to generate mirror current $I_2$. Current-voltage conversion circuit 202-2 can receive mirror current $I_2$, and may accordingly generate voltage $V_2$. For example, voltage $V_2$ can be proportional to voltage $V_1$. Thus, voltage $V_2$ can represent information related to DC input voltage $V_{in}$ of the switching power supply.

Holding circuit 203 can include charging control circuit 203-1 and discharging circuit 203-2. Charging control circuit 203-1 can receive voltage $V_2$ and micro-current source $I_S$, and may generate peak voltage signal $V_P$. For example, when peak voltage signal $V_P$ is less than voltage $V_2$, charging control circuit 203-1 can increase peak voltage signal $V_P$ through micro-current source $I_S$. Also, discharging circuit 203-2 can receive peak voltage signal $V_P$ and clock signal CLK, and can control a discharging rate of peak voltage signal $V_P$ according to clock signal CLK.

In this way, peak voltage signal $V_P$ can represent peak information of voltage $V_2$. Because of the relationship of voltage $V_2$ and DC input voltage $V_{in}$, peak voltage signal $V_P$ can represent peak information related to DC input voltage $V_{in}$. Thus, even when DC input voltage $V_{in}$ may be changing (e.g., in a transient condition), peak voltage signal $V_P$ can represent quasi-peak information of DC input voltage $V_{in}$. Then, peak voltage signal $V_P$ can be transmitted or otherwise supplied to an associated control circuit, as shown. For example, the control circuit can control switching (e.g., via pulse-width modulation [PWM] control) of main power switch or transistor $Q_M$ of the switching power supply.

In this way, voltage peak conversion circuit 202 and holding circuit 203 in particular embodiments can directly detect DC input voltage $V_{in}$ to acquire or determine input voltage information without the use of a resistor network or dividing resistors. As a result, chip pins, power losses on such resistors, and overall product costs, can be reduced, and the converter power supply efficiency can be improved, as compared to conventional approaches.

Figure 3:
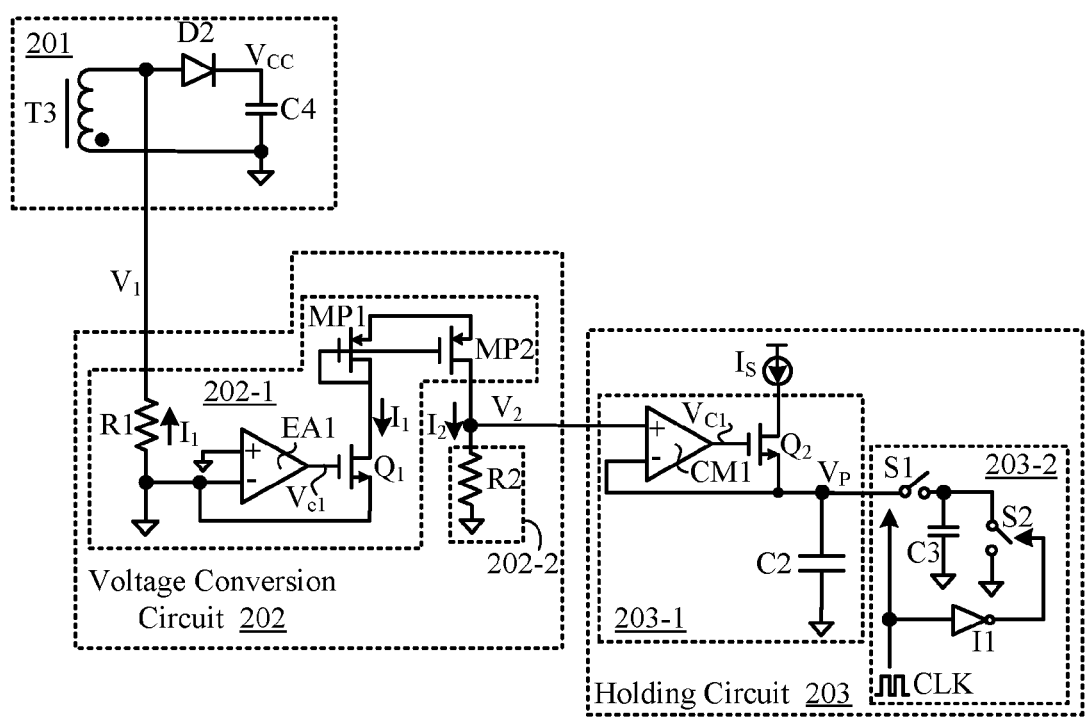
FIG. 3 is a schematic block diagram of example voltage conversion and holding circuits shown in FIG. 2, in accordance with embodiments of the present invention.

Referring now to FIG. 3, shown is a schematic block diagram of example voltage conversion and holding circuits shown in FIG. 2, in accordance with embodiments of the present invention. Voltage-current conversion circuit 202-1 can include resistor R1, error amplifier EA1, transistor $Q_1$, and a current mirror circuit. A first input of error amplifier EA1 can connect to ground, and a second input of error amplifier EA1 can be coupled to auxiliary inductor T3 in voltage coupling circuit 201 through resistor R1.

A control terminal (e.g., a gate) of transistor $Q_1$ can be coupled to an output of error amplifier EA1. A first power terminal (e.g., source/drain) of transistor $Q_1$ can be coupled to one terminal of the current mirror circuit, and a second power terminal (e.g., source/drain) of transistor $Q_1$ can be coupled to a second input of error amplifier EA1. When power switch $Q_M$ of the switching power supply is on, transistor $Q_1$ can also be turned on, and the current flowing through resistor R1 can be current $I_1$.

The current mirror circuit can receive current $I_1$, and may accordingly provide mirror current $I_2$. Here, the current mirror circuit can include two cascode-connected transistors (e.g., PMOS transistors) MP1 and MP2. Transistors MP1 and MP2 can be of the same type (e.g., both PMOS, or both NMOS) with a width to length ratio of 1:M. for example, transistors MP1 and MP2 can be two identical transistors. When transistor $Q_1$ is on (conducting), the current mirror circuit can generate mirror current $I_2$, which can equal current $I_1$ in this example (if transistors MP1 and MP2 are identically sized, etc.).

Voltage-current conversion circuit 202-2 can include resistor R2 having a first terminal coupled to the current mirror circuit to receive mirror current $I_2$, and a second terminal coupled to ground. As there is a mirror current flowing through resistor R2 in this case, a voltage generated at the first terminal of resistor R2 can be configured as voltage $V_2$. Furthermore, charging control circuit 203-1 can include comparator CM1, transistor $Q_2$, and charging capacitor C2. A first input of comparator CM1 can be coupled to voltage conversion circuit 202 to receive voltage $V_2$, a second input can be coupled to one terminal of charging capacitor $C_2$ to receive peak voltage signal $V_P$, and an output terminal can be coupled to a control terminal (e.g., gate) of transistor $Q_2$.

A control terminal of transistor $Q_2$ can receive an output signal of comparator CM1, a first power terminal can be coupled to micro-current source $I_S$, and a second power terminal of transistor $Q_2$ can connect to one terminal of charging capacitor C2. For example, the other terminal of charging capacitor C2 can connect to ground, and a voltage across charging capacitor C2 can be configured as peak voltage signal $V_P$.

Discharging circuit 203-2 can include switches (e.g., transistors) S1 and S2, and discharging capacitor C3. One terminal of switch S1 can connect to charging capacitor C2 to receive peak voltage signal $V_P$, and the other terminal of switch S1 can be coupled to ground via switch S2. One terminal of discharging capacitor C3 can connect to a common node of switches S1 and S2, and the other terminal of discharging capacitor C3 can connect to ground. For example, the switching operation of switch S1 can be controlled by clock signal CLK, and the switching operation of switch S2 can be controlled by an inverted version (e.g., via inverter I1) of clock signal CLK.

When power switch $Q_M$ is conducting or on, a voltage drop can be generated on primary winding T1. Auxiliary inductor T3 can couple the voltage on primary winding T1 of the transformer to determine voltage $V_1$, as shown below in formula (2).

$$V_1 = -\frac{N_2}{N_1} \times V_{in} \tag{2}$$

From equation (2) that, voltage $V_1$ can be proportional to DC input voltage $V_{in}$. Because voltage $V_1$ is negative, output signal $V_{e1}$ of error amplifier EA1 can be high, and transistor $Q_1$ can thus be on. Based on "virtual short" principles of error amplifier EA1, current $I_1$ flowing through resistor R1 can be as shown below in equation (3).

$$I_1 = -\frac{N_2}{N_1} \times \frac{V_{in}}{R_1} \tag{3}$$

Therefore, the current flowing through the left channel of the current mirror circuit can be current $I_1$, and according to mirroring principles, mirror current $I_2$ can be as shown below in equation (4).

$$I_2 = -\frac{N_2}{N_1} \times \frac{V_{in}}{R_1} \tag{4}$$

Because the current flowing through resistor R2 is mirror current $I_2$, voltage $V_2$ of resistor R2 can be as shown below in equation (5).

$$V_2 = \frac{N_2}{N_1} \times \frac{V_{in}}{R_1} \times R_2 \tag{5}$$

It can be seen from equation (5) that voltage $V_2$ can be proportional to DC input voltage $V_{in}$. Thus, voltage $V_2$ can represent information related to DC input voltage $V_{in}$. In addition, it can be seen from equations (2) and (5) that voltage $V_1$ can also be proportional to voltage $V_2$. Thus, by regulation of voltage conversion circuit 202 in particular embodiments, voltage $V_2$ can be consistent with DC input voltage $V_{in}$.

In particular embodiments, comparator CM1 can compare voltage $V_2$ against peak voltage signal $V_P$. When peak voltage signal $V_P$ is less than (e.g., less in absolute value) voltage $V_2$, output terminal signal $V_{C1}$ of comparator CM1 can go high, transistor $Q_2$ can be on, and micro-current source $I_S$ can charge charging capacitor C2. Peak voltage signal $V_P$ may increase until peak voltage signal $V_P$ reaches a level of voltage $V_2$. Then, output signal $V_{C1}$ of comparator CM1 can go low, transistor $Q_2$ can be turned off, and charging capacitor C2 can be discharged through the discharging circuit.

The discharging rate of capacitor C2 can be determined by a period and/or a duty cycle of clock signal CLK, as well as the capacitances of charging capacitor C2 and discharging capacitor C3. For example, the period and/or duty cycle of clock signal CLK can be fixed or variable (e.g., programmable by the user). Also, other components or arrangements for circuitry as described herein can be supported in particular embodiments. For example, discharging capacitor C3 in discharging circuit 203-2 can be replaced by other discharging components, such as an adjustable current source.

As discussed above, the voltage peak detection circuit may need to respond to transient peak information of DC input voltage $V_{in}$. In particular embodiments, the equivalent time constant $\tau_{eq}$ of holding circuit 203 in accordance with embodiments of the present invention can be: $\tau_{eq} = C2 \times R_{eq}$. Here, C2 can denote the capacitance of charging capacitor C2, and $R_{eq}$ can denote the equivalent resistance of holding circuit 203. The value of equivalent resistance $R_{eq}$ can be as shown below in equation (7).

$$R_{eq} \approx \frac{T_{CLK} \times (C_2 + C_3)}{C_2 \times C_3} \tag{7}$$

Here, C3 can denote the capacitance of discharging capacitor C3, and $T_{CLK}$ can denote the period of clock signal CLK. If C2 is much greater than C3, then equivalent resistor $R_{eq}$ can be as shown below in equation (8).

$$R_{eq} \approx \frac{T_{CLK}}{C_2} \tag{8}$$

Equation (9) can be arrived at by substituting equation (8) into equation (6), as shown below.

$$\tau_{eq} \approx \frac{T_{CLK} \times C_2}{C_3} \tag{9}$$

When equivalent time constant $\tau_{eq}$ is about 100 ms, and $T_{CLK}$ is about 1 ms, C2 is about 50 pF, the capacitance of discharging capacitor C3 is about 0.5 pF. Alternatively, when C2 is about 10 pF, the capacitance of the discharging capacitance is about 0.1 pF. Thus, it can be seen that under conditions when the transient response of the DC input voltage peak is satisfied, the capacitance of discharging capacitor C3 in particular embodiments can be relatively small. Thus, because large resistors and capacitors may not be needed in this approach, product costs and size can be substantially reduced to facilitate circuit integration.

In one embodiment, a method of detecting a voltage peak for a switching power supply, can include: (i) generating a first voltage that represents a DC input voltage of the switching power supply by coupling an input inductor voltage of the switching power supply; (ii) performing, by a voltage conversion circuit, a conversion on the first voltage to generate a second voltage that is proportional to the first voltage; and (iii) generating a peak voltage signal by holding a peak of the second voltage, where the peak voltage signal represents peak information of the DC input voltage.

Figure 4:
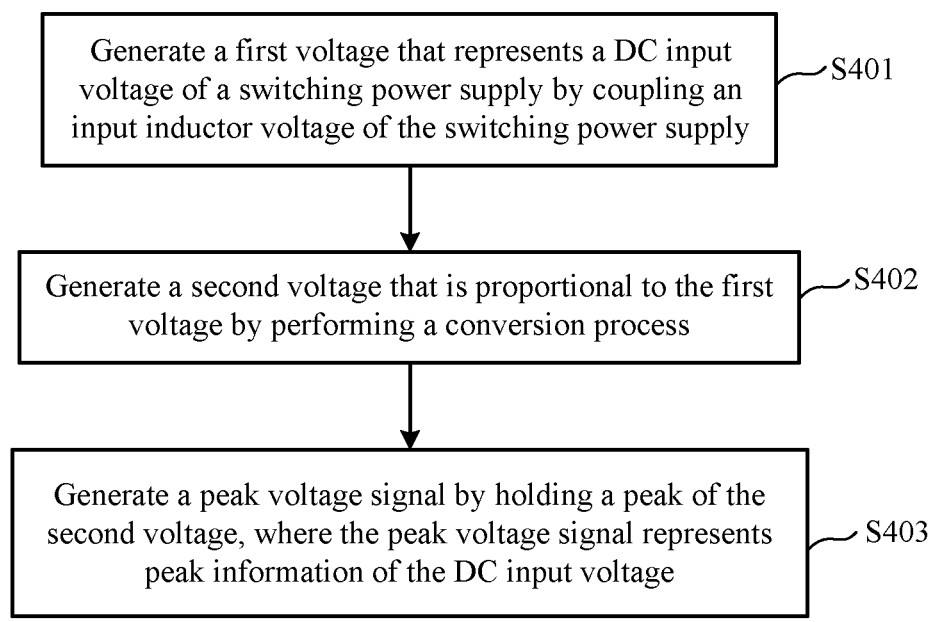
FIG. 4 is a flow diagram of an example method of detecting a voltage peak in accordance with embodiments of the present invention.

Referring now to FIG. 4, shown is a flow diagram of an example method of detecting a voltage peak in accordance with embodiments of the present invention. This particular voltage peak detection method can be applied for a switching power supply that can receive an external input voltage (e.g., $V_{ac}$), and generate therefrom a DC input voltage (e.g., $V_{in}$) after being rectified by a rectifier bridge. At S401, a first voltage (e.g., $V_1$) that represents the DC input voltage of the switching power supply can be generated by coupling an input inductor voltage of the switching power supply. For example, an auxiliary winding (e.g., T1) can be employed to inductively couple to the input inductor voltage of the switching power supply.

At S402, a second voltage (e.g., $V_2$) that is proportional to the first voltage can be generated by performing a conversion process. For example, voltage conversion circuit 202 can be employed to convert from voltage signal $V_1$ to voltage signal $V_2$. In particular, voltage $V_1$ can be converted to mirror current $I_2$ by voltage-current conversion circuit 202-1, and mirror current $I_2$ can be converted to voltage $V_2$ by current-voltage conversion circuit 202-2.

At S403, a peak voltage signal can be generated by holding a peak of the second voltage. For example, holding circuit 203 can be used to hold the peak of voltage $V_2$. The peak voltage signal can represent peak information of DC input voltage $V_{in}$ of the switching power supply. In particular, voltage $V_2$ and a micro-current source (e.g., $I_S$) can be used to generate the peak voltage signal. Voltage $V_2$ can be compared (e.g., via comparator CM1) against the peak voltage signal (e.g., $V_P$), and when the peak voltage signal is less (e.g., in absolute value) than voltage $V_2$, the peak voltage signal can be increased via micro-current source $I_S$. In addition, the discharging rate of the peak voltage signal can be controlled (e.g., via discharging circuit 203-2) according to clock signal CLK.

Thus in particular embodiments, a voltage coupling circuit can be utilized to generate DC input voltage information, instead of sampling the DC input voltage information by directly connecting to a power stage circuit. In this way, the number of chip pins for external connections can be decreased, power losses can be reduced, and conversion efficiency can be improved without use of a sampling resistor or the like. In addition, the voltage conversion circuit and holding circuit of particular embodiments can perform conversion and a holding process on a voltage (e.g., $V_1$) output by the voltage coupling circuit. This can be used to generate a peak voltage signal that represents the DC input voltage without using components, such as a relatively large resistor or relatively large capacitor. Thus, the overall costs can be extensively reduced, as compared to conventional approaches.

The above describes particular example voltage peak detection circuitry and detection methods, and those skilled in the art will recognize that other techniques, structures, circuit layout, and/or components can be utilized in particular embodiments. In addition to the flyback topology switching power supply for the voltage peak detection circuit and method described above, other suitable topologies (e.g., boost, buck, buck-boost, forward, SEPIC, ZETA, etc.) for switching power supplies, as well as other types of power supplies or converters, can also be supported in particular embodiments.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A peak voltage detection circuit, comprising:
    a) a voltage coupling circuit configured to inductively couple by an auxiliary inductor to an input inductor of a switching power supply, and to generate a first voltage in direct proportion with a DC input voltage of said switching power supply;
    b) a voltage conversion circuit configured to receive said first voltage, and to generate a second voltage that is proportional to a magnitude of said first voltage; and
    c) a holding circuit configured to hold a peak value of said second voltage to generate a peak voltage signal that represents a peak value of said DC input voltage, wherein a time constant of said holding circuit is configured to meet a transient response requirement of said peak value of said DC input voltage.

2. The peak voltage detection circuit of claim 1, wherein said voltage coupling circuit comprises said auxiliary inductor coupled to said input inductor of said switching power supply, and wherein said first voltage is generated as a negative number based on an induced voltage of said auxiliary inductor.

3. The peak voltage detection circuit of claim 1, wherein said voltage conversion circuit comprises:
    a) a voltage-current conversion circuit configured to receive said first voltage, and to generate a first current based on said first voltage;
    b) said voltage-current conversion circuit being configured to generate a mirror current by mirroring said first current; and
    c) a current-voltage conversion circuit configured to receive said mirror current, and to generate said second voltage based on said mirror current.

4. The peak voltage detection circuit of claim 3, wherein said voltage-current conversion circuit comprises:
    a) a first error amplifier having a first input coupled to ground, and a second input coupled to said voltage coupling circuit through a first resistor;
    b) a first transistor having a control terminal coupled to an output of said first error amplifier, a first power terminal coupled to a current mirror circuit, and a second power terminal coupled to a second input of said first error amplifier;
    c) said first transistor being configured to turn on when a power switch of said switching power supply is on, wherein a current flowing through said first resistor is configured as said first current; and
    d) said current mirror circuit being configured to generate said mirror current by mirroring said first current.

5. The peak voltage detection circuit of claim 3, wherein said current-voltage conversion circuit comprises a second resistor, said mirror current is configured to flow through said second resistor, and wherein a voltage across said second resistor is configured as said second voltage.

6. The peak voltage detection circuit of claim 1, wherein said holding circuit comprises:
    a) a charging control circuit configured to receives said second voltage and a micro-current source, and to generate said peak voltage signal, wherein said charging control circuit is configured to increase said peak voltage signal through said micro-current source when said peak voltage signal is less than said second voltage; and b) a discharging circuit configured to control a discharging rate of said peak voltage signal according to a clock signal.

7. The peak voltage detection circuit of claim 6, wherein said charging control circuit comprises:
   a) a first comparator having a first input coupled to receive said second voltage, and a second input coupled to a charging capacitor, wherein said charging capacitor has a terminal coupled to ground;
   b) a second transistor having a control terminal that receives an output of said first comparator, a first power terminal coupled to said micro-current source, and a second power terminal coupled to said charging capacitor; and
   c) wherein a voltage across said charging capacitor is configured as said peak voltage signal.

8. The peak voltage detection circuit of claim 7, wherein said discharging circuit comprises:
   a) a first switch coupled to said charging capacitor to receive said peak voltage signal, and to ground by series coupling with a second switch;
   b) a discharging capacitor coupled to a common node of said first and second switches, and to ground; and
   c) wherein a switching operation of said first switch is controlled by said clock signal, and a switching operation of said second switch is controlled by an inverted version of said clock signal.

9. The peak voltage detection circuit of claim 1, wherein said time constant of said holding circuit is greater than a period of said DC input voltage.

10. The peak voltage detection circuit of claim 9, wherein said time constant is 100 ms.

11. A switching power converter, comprising the peak voltage detection circuit of claim 1, and being configured to generate said peak voltage signal that represents a peak value of an input voltage of said switching power converter, wherein said voltage peak detection circuit is inductively coupled to said input inductor of said switching power converter.

12. The switching power converter of claim 11, wherein said input inductor is arranged such that a voltage across said input inductor is proportional to a magnitude of said input voltage.

13. The peak voltage detection circuit of claim 1, wherein said magnitude of said first voltage is directly proportional to said DC input voltage, and said first voltage is configured as a negative number.

14. The peak voltage detection circuit of claim 1, wherein said first voltage is directly connected to said auxiliary inductor.

15. A method of detecting a voltage peak for a switching power supply, the method comprising:
   a) generating a first voltage in direct proportion with a DC input voltage of said switching power supply by coupling by an auxiliary inductor to an input inductor of said switching power supply;
   b) performing, by a voltage conversion circuit, a conversion on said first voltage to generate a second voltage that is proportional to a magnitude of said first voltage; and
   c) generating, by a holding circuit, a peak voltage signal by holding a peak value of said second voltage, wherein said peak voltage signal represents a peak value of said DC input voltage, wherein a time constant of said holding circuit is configured to meet a transient response requirement of said peak value of said DC input voltage.

16. The method of claim 15, wherein said performing said conversion further comprises:
   a) generating a first current corresponding to said first voltage;
   b) generating a mirror current by mirroring said first current; and
   c) generating said second voltage based on said mirror current.

17. The method of claim 15, wherein said generating said peak voltage signal further comprises:
   a) increasing said peak voltage signal using a micro-current source when said peak voltage signal is less than said second voltage; and
   b) controlling a discharging rate of said peak voltage signal based on a clock signal.

18. The method of claim 15, wherein said time constant of said holding circuit is greater than a period of said DC input voltage.

19. The method of claim 18, wherein said time constant is 100 ms.

20. The method of claim 15, wherein said magnitude of said first voltage is directly proportional to said DC input voltage, and said first voltage is configured as a negative number.

* * * * *